US007663524B2

(12) United States Patent
Lin et al.

(10) Patent No.: US 7,663,524 B2
(45) Date of Patent: *Feb. 16, 2010

(54) MULTI-CHANNEL DISPLAY DRIVER CIRCUIT INCORPORATING MODIFIED D/A CONVERTERS

(75) Inventors: Chun-Fu Lin, Taoyuan County (TW); Keng-Chih Kuo, Pingtung County (TW); Yu-Chun Chuang, Hsinchu (TW)

(73) Assignee: Silicon Touch Technology Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/109,354

(22) Filed: Apr. 25, 2008

(65) Prior Publication Data

US 2008/0204293 A1 Aug. 28, 2008

Related U.S. Application Data

(63) Continuation-in-part of application No. 10/987,575, filed on Nov. 12, 2004, now Pat. No. 7,379,003.

(30) Foreign Application Priority Data

Nov. 13, 2003 (TW) .............................. 92131743 A

(51) Int. Cl.
*H03M 1/66* (2006.01)

(52) U.S. Cl. ........................ 341/144; 345/102; 341/152

(58) Field of Classification Search ................. 341/144, 341/152; 345/8, 102, 63, 152
See application file for complete search history.

(56) References Cited

U.S. PATENT DOCUMENTS

| | | | | |
|---|---|---|---|---|
| 5,455,681 | A * | 10/1995 | Ng | 358/3.01 |
| 6,067,066 | A * | 5/2000 | Kubota et al. | 345/98 |
| 6,169,505 | B1 * | 1/2001 | Nishimura et al. | 341/141 |
| 6,441,829 | B1 * | 8/2002 | Blalock et al. | 345/690 |
| 7,009,056 | B2 * | 3/2006 | Garthwaite et al. | 546/211 |
| 2002/0084957 | A1 * | 7/2002 | Fisekovic | 345/63 |

* cited by examiner

*Primary Examiner*—Peguy JeanPierre
(74) *Attorney, Agent, or Firm*—Jianq Chyun IP Office

(57) ABSTRACT

A multi-channel display driver circuit incorporating modified D/A converters has a plurality of digital comparators connected to a number generator. Each digital comparator has an output, a digital data input and a reference input. The reference inputs of all digital comparators are connected to the number generator and the outputs are respectively connected to corresponding data channels of a display. By the proposed technique, each digital comparator obtains a unique non-sequence reference signal, and then compares it with the input digital data signal. Since the non-sequential signals are input to the reference input of the digital comparator, the overshoot distortion, the harmonic distortion and the electromagnetic interference problems are prevented. Therefore, the precise imaging can be obtained with this signal modulation technique in small circuit size.

9 Claims, 20 Drawing Sheets

MULTI-CHANNEL DISPLAY DRIVER CIRCUIT INCORPORATING MODIFIED D/A CONVERTERS

CROSS-REFERENCE TO RELATED APPLICATION

This is a continuation-in-part application of patent application Ser. No. 10/987,575 filed on Nov. 12, 2004, which claims the priority benefit of Taiwan patent application serial no. 92131743, filed Nov. 13, 2003 and is now allowed. The entirety of each of the above-mentioned patent applications is hereby incorporated by reference herein and made a part of this specification.

BACKGROUND OF THE INVENTION

1. Field of the Invention

The present invention is related to a multi-channel display driver circuit incorporating modified digital-to-analog (D/A) converters, and more particularly to a modified pulse width modulated D/A converter circuit to convert input digital signals to analog output for data imaging on the display apparatus, capable of overcoming harmonic distortion and electromagnetic interference, that occur in a display driver circuit using conventional pulse width modulation digital-to-analog converters.

2. Description of Prior Art

The so-called digital display actually draws on the various technologies from electro-optics, electronics, biochemistry, and semiconductor domains. A multi-channel display driver is an important component in the new generation of display apparatuses used to control simultaneous output of video data.

In recent years, different multi-channel display driver circuits have been devised by many manufacturers of digital displays to meet requirements for high speed display and to downsize the circuit components.

For conventional multi-channel display driver circuits, in an effort to downsize the circuit components, manufacturers often use pulse width modulated (PWM) digital-to-analog (D/A) converters in the display driver circuit. The architecture of a conventional PWM D/A converter circuit is shown in FIG. 1, comprising a sequential counter (41) and a plurality of parallel digital comparators (40).

The sequential counter (41) may be either an up counter or a down counter, which outputs a sequence signal represented by a given number of bits (n bits) which are the same as the number of bits of a digital data signal received by the D/A converter.

The outputs of the digital comparators (40) are respectively connected to a corresponding data channel of a display apparatus (42) in parallel, and each digital comparator (40) has a digital data input and a reference input, and wherein the reference input is connected to the sequential counter (41) to obtain a sequence signal as a reference signal of the digital comparator (40).

The reference inputs of all digital comparators (40) in the PWM D/A converter circuit are connected to the sequential counter (41) with the same sequence of bits (0-bit.about.n-bit) as shown in FIG. 2, so that all digital comparators (40) use the same reference signals. These reference signals are to be compared with the input digital data signals. If the value of input digital data signal is greater than or equal to that of the reference signal, then the digital comparator (40) will output a high voltage pulse, and if the value of input data digital signal is smaller than that of the reference signal, the digital comparator (40) will output a low voltage pulse.

In FIGS. 3A and 3B, two different waveforms of the output signals are generated from the digital comparator using two different digital data signals in a given time period. If the sequential counter (41) overflows, the sequential counter (41) will be reset to start all over again, and the output of a digital comparator (40) normally terminates at the end of a complete output cycle period. For example using a 10-bit sequential counter, when the sequential counter (41) output sequence signal's value reaches 1024, the sequential counter (41) is reset to start the next output cycle period. The bit-length of each output cycle period is dependent on the number of bits contained in the output of the sequential counter (41) and the clock rate driving the sequential counter (41).

The above PWM D/A converter circuit is mainly consisted of one sequential counter (41) and the plurality of digital comparators (40). Therefore, a multi-channel display driver using this type of D/A converter can be built with a small-size circuit and low costs, but these D/A converters have the following disadvantages.

First, if the output signal of pulse width modulation is sustained for a given time period short of a complete output cycle, the sampled analog signal waveform will tend to concentrate towards either high voltage or low voltage side, thus causing the overshoot distortion of the DC level. Second, flickering will appear on the display apparatus when low order harmonics of pulse width modulated signals are produced.

The flickering phenomenon will further worsen if the number of bits in a digital data signal is extended. This is because the output cycle period of a pulse width modulated signal also has to be extended to cover the extra bits, and the effect of a longer duty cycle will multiply during line scanning, leading to even more serious harmonic distortion and flickering.

For example, if the input digital signal and the counter both are 10 bits, the output signal shall be stored with a normal cycle period of 1024 ($2^{10}$=1024) clocks. If the cycle period of output signal is extended, provided that the clock rate is constant, then the frame rate has to be reduced in inverse proportion. Once the frame rate or screen refresh rate drops to a level that human eyes are able to detect, flickering will appear on the display apparatus. Therefore, the conventional PWM D/A converter circuit is susceptible to low frequency harmonics, and as a result the imaging quality will be degraded. This harmonic distortion phenomenon happens since the sequential counter outputs sequence signals. Therefore, the PWM D/A converter couldn't provide a quality image output although its size is small.

Another D/A converter circuit that uses sigma-delta modulation technique can produce good images. This sigma-delta D/A converter circuit, as shown in FIG. 4, is formed by a plurality of parallel sigma-delta converters (50), wherein each sigma-delta converter (DAC) (50), as shown in FIG. 12, is mainly consisted of an adder (51), a loop filter (52) and a quantizer (53); wherein one input of the adder (51) is used for receiving digital signal input (Digital In), and another input is used to receive the output fed from the quantizer (53), thus forming a feedback loop (54).

The adder (51) in the sigma-delta converter (50) uses the signal fed back by the quantizer (53) to subtract from the digital signal to produce an error signal (Es), and then the error signal (Es) is sampled and again input through the feedback loop (54), where the error signal (Es) is synthesized with subsequent input and then forwarded to the quantizer (53) again through the loop filter (52). As the value of the error signal (Es) represents the difference between the quantized signal and the digital signal, the returned error value through the sigma-delta loop (54) can correct the previous quantizing error to make the output from the quantizer (53) of sigma-delta converter (50) free from first harmonics.

In FIGS. 6A and 6B, from the time-domain signal waveform of two different outputs from the sigma-delta converter, high (512/1024) and low (299/1024) DC levels are dispersed across a given time period. It can be clearly seen that the average DC magnitude of the output in FIG. 6A is greater than that of FIG. 6B (512>299), as the time-domain signal waveform of FIG. 6A is more concentrated than that of FIG. 6B. When these two signals are output to the display apparatus, the image produced by the output of FIG. 6A will be brighter than that of FIG. 6B. From the output time-domain signal waveforms of the sigma-delta converter, it can also be observed that the sampled analog signal waveform from the output of the sigma-delta converter does not have to rely on a complete output cycle period to produce precise DC levels, and yet the summation of sampled high and low levels can closely approximate the target output value. Therefore, overshoot distortion of the DC level will never occur using the sigma-delta modulation technique.

In FIGS. 7A and 7B, from the comparative frequency spectrum of the output from the sigma-delta converter and the PWM D/A converter, it is apparent that the operation of the sigma-delta converter circuit can completely remove the first harmonics due to the reasons already explained in the above paragraph.

Though the above sigma-delta D/A converter circuit produces better results than the PWM D/A converter circuit, the construction of each sigma-delta converter is more complicated. Besides, if the sigma-delta D/A converter circuit is to be applied in a multi-channel data driver, a matching number of sigma-delta converters for multiple data channels will be required. Therefore, the sigma-delta D/A converter circuit will take up more circuit space than the equivalent PWM D/A converter circuit.

The current situation is that D/A converters in multi-channel display driver circuits cannot be downsized and still have good performance, no matter which signal modulation technique is used.

SUMMARY OF THE INVENTION

Accordingly, the present invention is directed to multi-channel display driver circuit incorporating modified digital-to-analog (D/A) converters.

The present invention provides a multi-channel display driver circuit incorporating modified digital-to-analog (D/A) converters, and the multi-channel display driver circuit comprises a plurality of digital comparators and a non-sequential number generator. Wherein each of the digital comparators has a digital data input, a reference input with multiple bit lines, and an output that is connected to a corresponding data channel of a display apparatus. The non-sequential number generator has multiple output bit lines and comprises a pseudo-random number generator and a counter. The pseudo-random number generator produces pseudo-random numbers, and may be a de Bruijn's counter or a Linear-Feedback Shift Register (LFSR) counter. The counter is connected to the pseudo-random number generator in cascade, and is together with the pseudo-random number generator to produce a non-sequential reference signal outputting to the reference input of each digital comparator. The counter provides a plurality of less significant bits to the digital comparators, and the pseudo-random number generator provides a plurality of most significant bits to the digital comparators. The non-sequential reference signal is represented by the output bit lines of the non-sequential number generator.

According to an embodiment of the present invention, the bit lines of the reference input of each digital comparator are sequentially connected to the output bit lines of the non-sequential number generator.

According to an embodiment of the present invention, the bit lines of the reference input of each digital comparator are non-sequentially connected to the output bit lines of the non-sequential number generator, whereby each digital comparator receives the same non-sequential reference signal.

According to an embodiment of the present invention, the LFSR counter is designed to have $2^n$ cycle length, or to have a $(2^n-1)$ cycle length without any lock-up state. Wherein n is the bit number of the LFSR counter.

The present invention provides a multi-channel display driver circuit incorporating modified digital-to-analog (D/A) converters, comprising a plurality of digital comparators and a non-sequential number generator with multiple output bit lines. Wherein each of the digital comparators has a digital data input, a reference input with multiple bit lines, and an output that is connected to a corresponding data channel of a display apparatus. The non-sequential number generator produces a non-sequential reference signal outputting to the reference input of each digital comparator, comprising a pseudo-random number generator to produce pseudo-random numbers, and wherein the random number generator is a de Bruijn's counter or a LFSR counter. The non-sequential reference signal is represented by the output bit lines of the non-sequential number generator. The bit lines of the reference input of each digital comparator are non-sequentially connected to the output bit lines of the non-sequential number generator, and each connection between the digital comparator and the output bit lines is different from others. Whereby each digital comparator receives a unique sequence value and a unique reference signal, and then compares the unique reference signal and an independent data input signal which is represented by a digital data input with multiple bit lines of each comparator.

According to an embodiment of the present invention, the non-sequential number generator further comprises a counter. Wherein the counter is connected to the non-sequential number generator in cascade, and is together with the non-sequential number generator to produce a non-sequential reference signal outputting to the reference input of each digital comparator.

According to an embodiment of the present invention, the LFSR counter is designed to have $2^n$ cycle length, or to have a $(2^n-1)$ cycle length without any lock-up state. Wherein n is the bit number of the LFSR counter.

According to one of the aspects of the present invention, as the reference signals to the digital comparator are pseudo-random or non-sequential signals, the modified D/A converter generates the output signal with randomly dispersed pulses. The output signal formed of a sampled analog signal and closely approximate the target value as the high and low DC levels of the analog signals are more evenly distributed throughout a given time period. The output signals of digital comparators will be moderated from the extreme values in each time period, such that the abnormal phenomenon where the high or low DC levels are over-concentrated in either the first half or the second half of output cycle is eliminated. Thus the overshoot distortion of DC level is improved, whereas in the conventional PWM D/A converter circuit overshoot distortion of DC level occurs when the analog signal waveform is not sampled from output signal of a complete output cycle.

Therefore, the output signal of digital comparators may be sampled with any time period, irrespective of output cycle, and yet the summation of sampled high and low levels still can closely approximate the target output value. If the actual output value is divided by the target output value, the ratio will be close to the ideal value (ideal rate=1.0). Therefore, the overshoot distortion of DC level, if any, shall be far less in the present invention than using the conventional pulse width modulation (PWM technique. Moreover, as the output signal dispersed, the effect of first harmonics and flickering on the display screen can be greatly reduced.

According to one of the aspects of the present invention, if all digital comparators are connected to the non-sequential number generator, all digital comparators will obtain the same reference signals. Therefore, when multiple bit lines of the digital comparator are switched simultaneously, the parasitic inductance collected from adjacent bit lines will produce a surge current that can give rise to considerable amount of electromagnetic interference detrimental to the operation of components. In the present invention, the pseudo-random number generator and the sequential counter are connected to each digital comparator through the bit lines non-sequentially, whereby all digital comparators will obtain a unique reference signal derived therefrom in the same time period. Therefore, the chance of simultaneous switching of the digital comparators is considerably reduced and the D/A converter circuit can operate without electromagnetic interference.

According to one of the aspects of the present invention, these digital comparators are connected to a pseudo-random number generator and a sequential counter, thus a simple architecture like a conventional PWM D/A converter circuit can be retained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
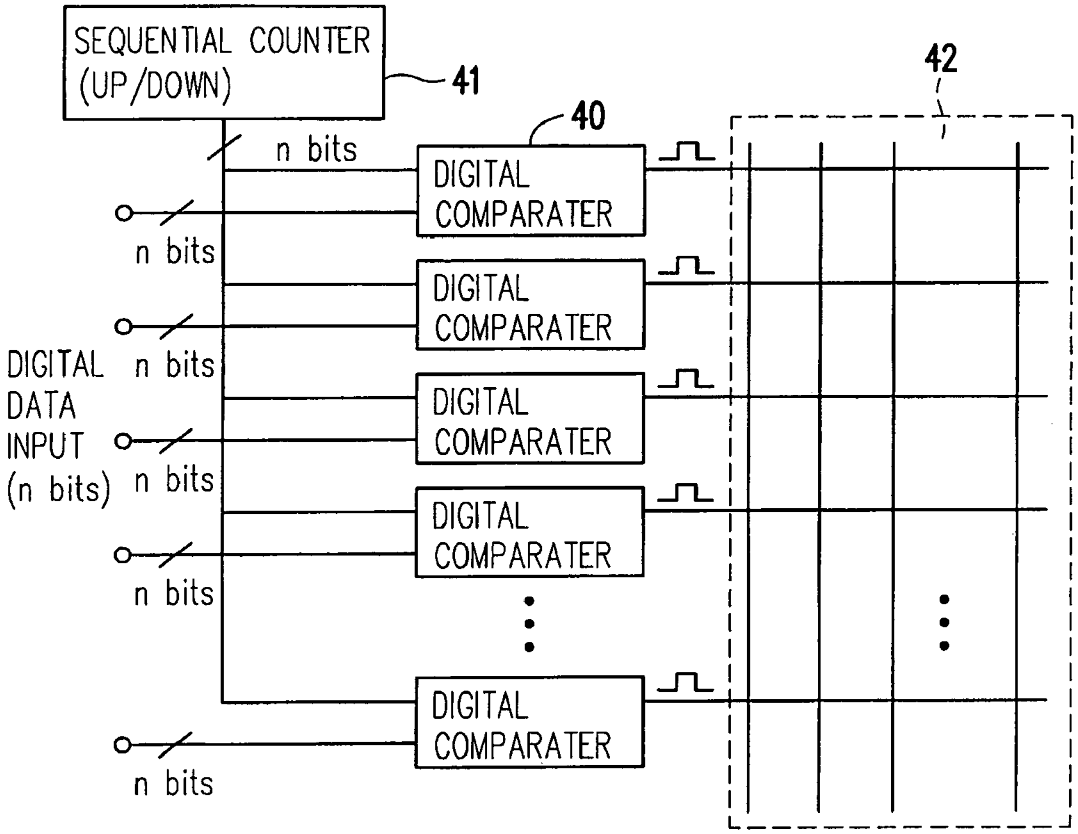
FIG. 1 (PRIOR ART)
FIG. 1 is a block diagram of the architecture of a conventional PWM D/A converter circuit.
Figure 2:
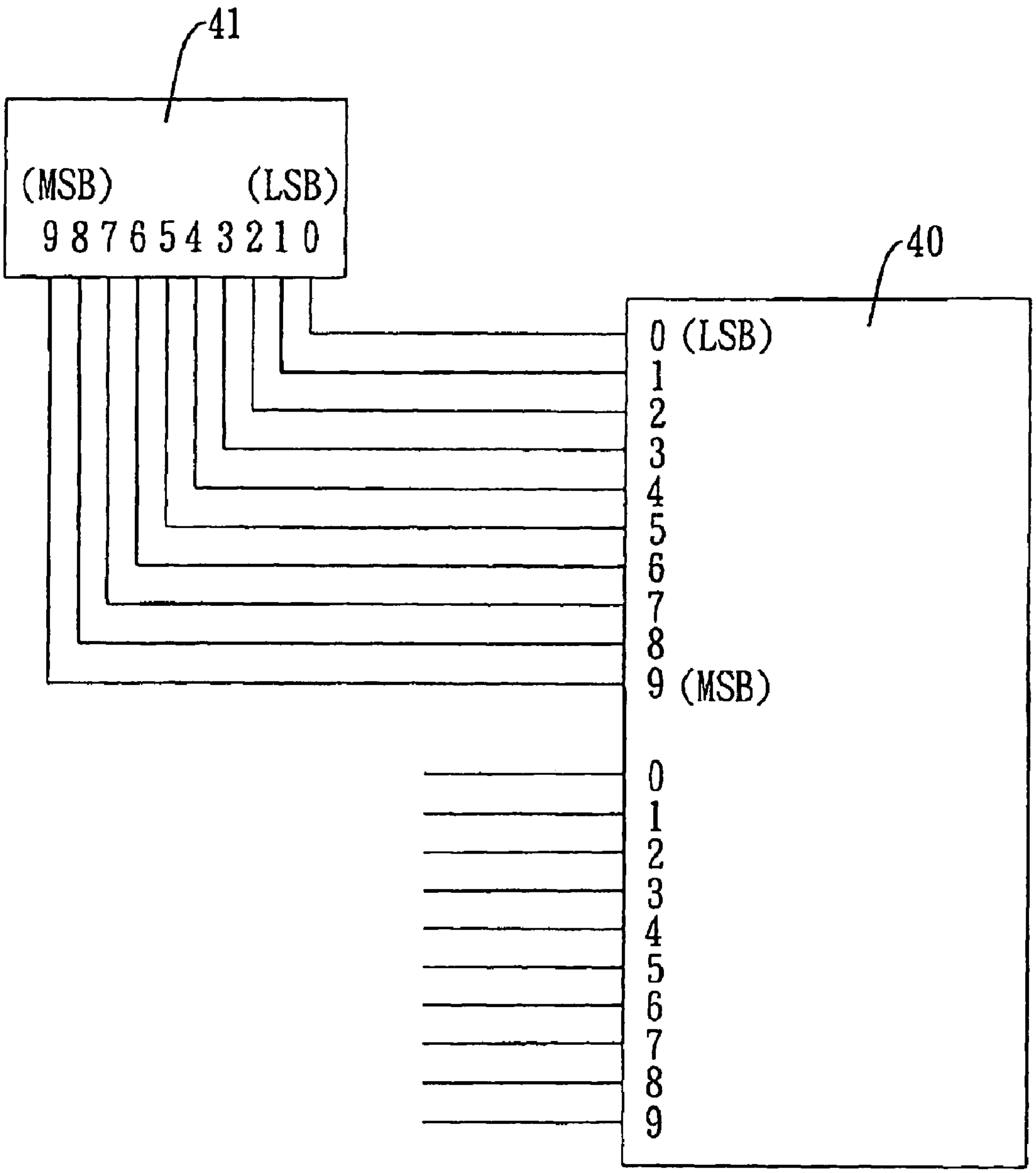
FIG. 2(PRIOR ART)
FIG. 2 is a diagram showing the bit line connection from the sequential counter to each digital comparator originally shown in FIG. 1.
Figure 3A:
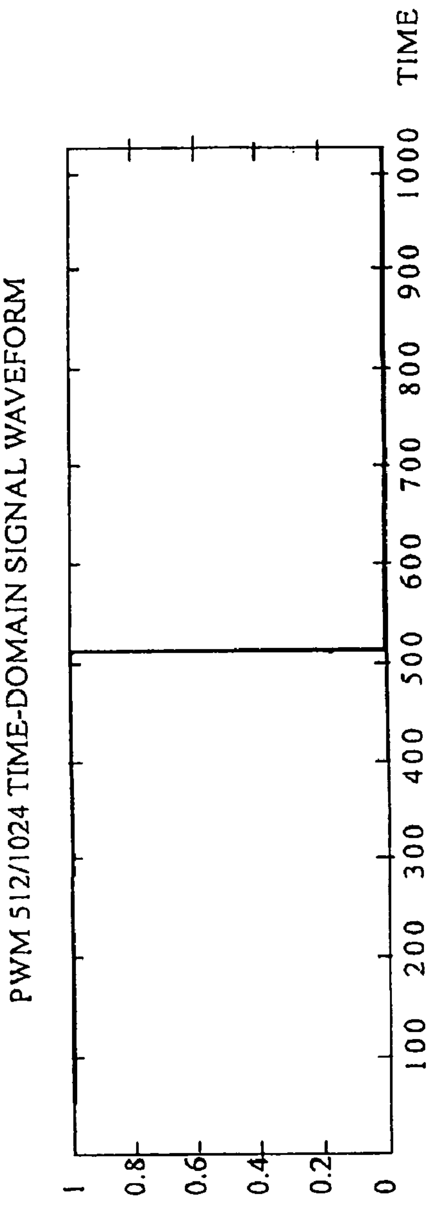
FIG. 3A(PRIOR ART)
FIGS. 3A and 3B show the output signals of the conventional PWM D/A converter shown in FIG. 1 using the input of two different digital data signals.
Figure 3B:
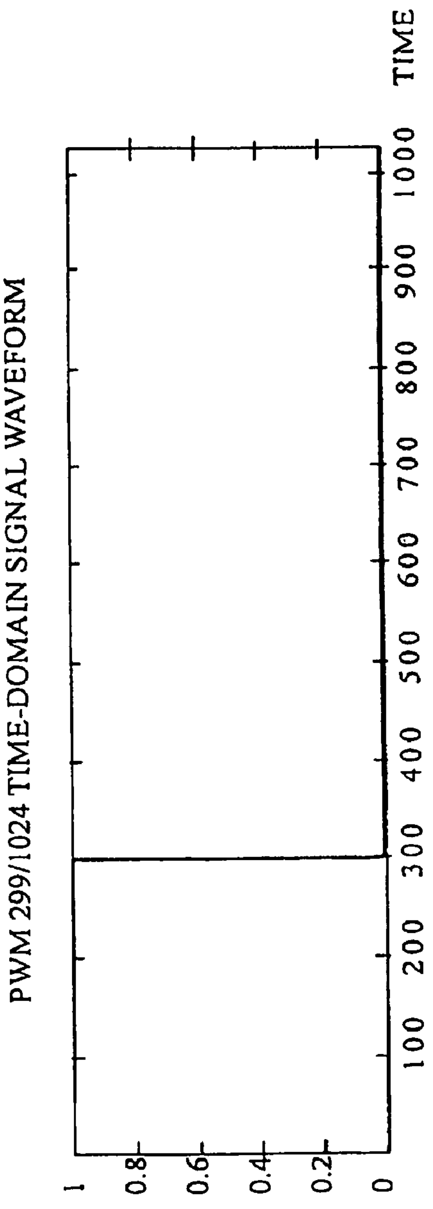
FIG. 3B(PRIOR ART)
Figure 4:
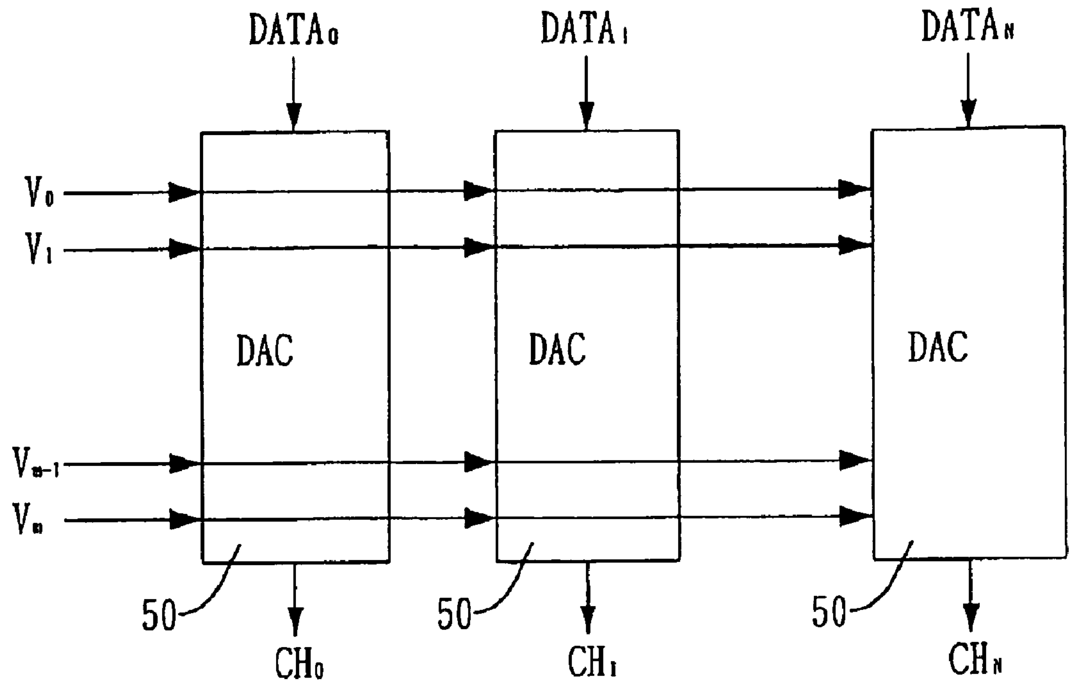
FIG. 4 (PRIOR ART)
FIG. 4 is a block diagram of the architecture of a sigma-delta D/A converter circuit.
Figure 5:
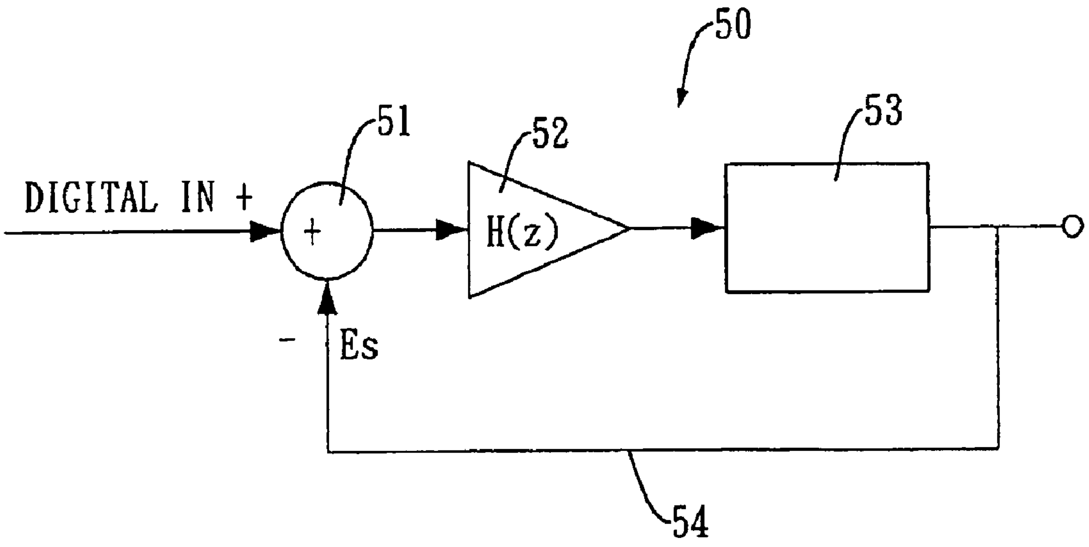
FIG. 5 (PRIOR ART)
FIG. 5 is a detailed diagram of the structure of the sigma-delta converter originally shown in FIG. 4.
Figure 6A:
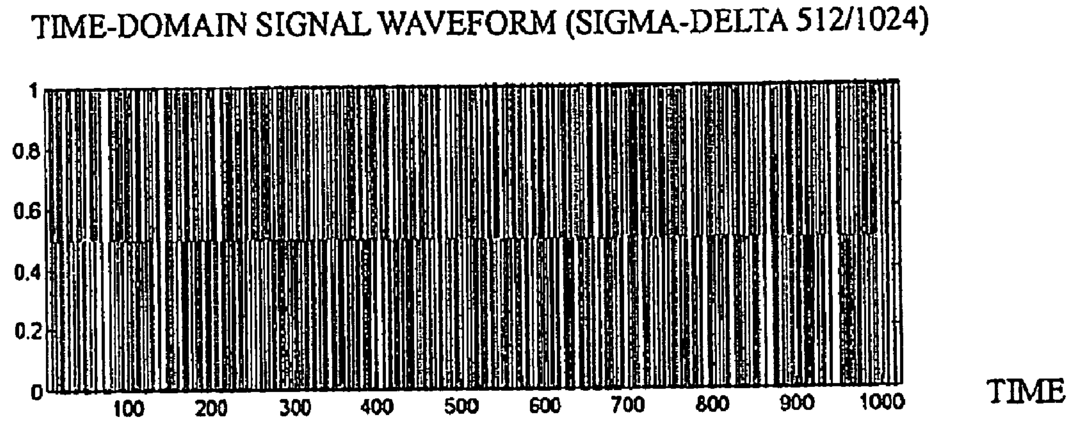
FIG. 6A(PRIOR ART)
FIGS. 6A and 6B respectively show two time-domain waveform of the output signals from sigma-delta converter using the same two digital signals originally shown in FIG. 4.
Figure 6B:
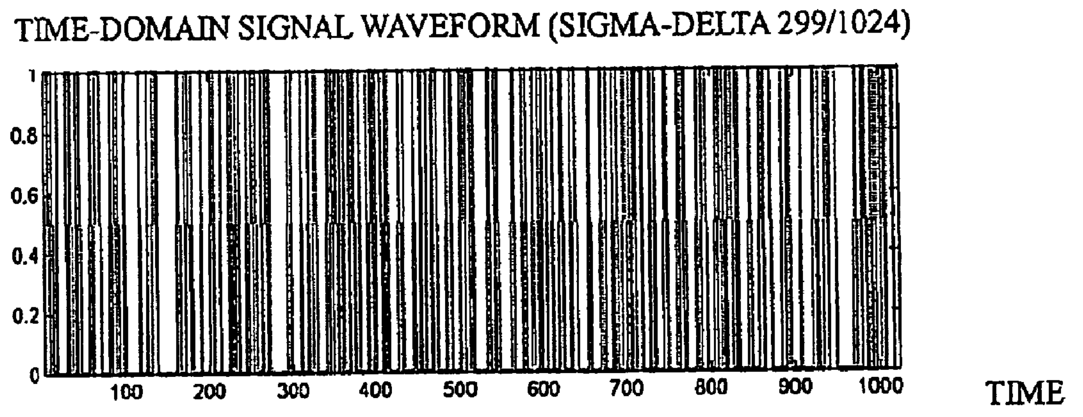
FIG. 6B(PRIOR ART)
Figures 7A, 7B:
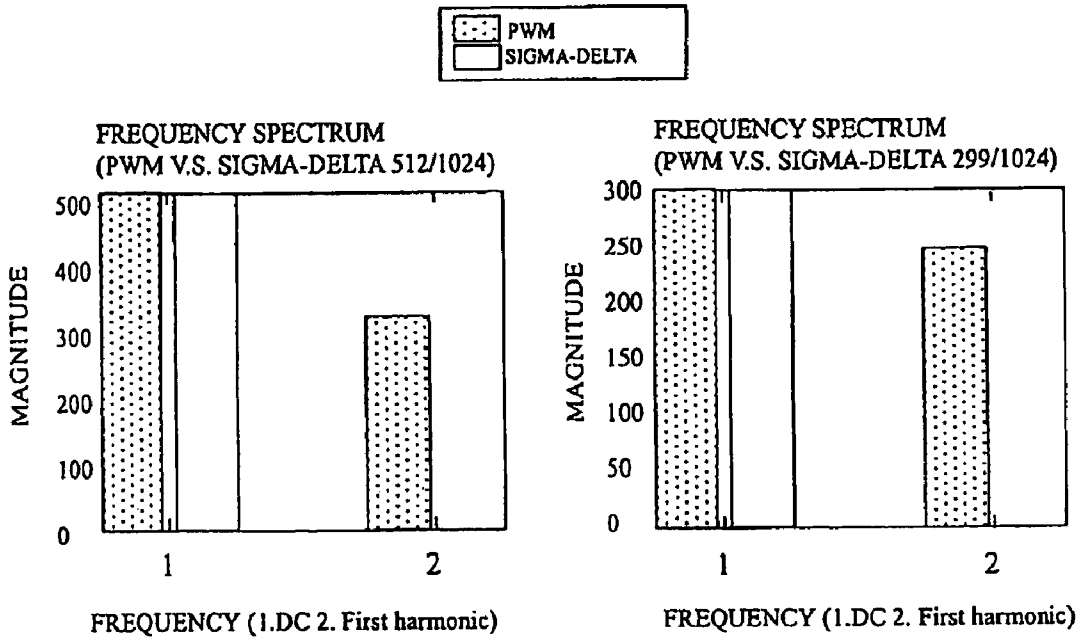
FIG. 7A(PRIOR ART) FIG. 7B(PRIOR ART)
FIGS. 7A and 7B show two comparative outputs of the sigma-delta converter and conventional PWM DAC when two different digital data signals are input into the D/A converters, in which the DC magnitude of first harmonics for input of two different digital data signals are clearly demonstrated.

Reference will now be made in detail to the present preferred embodiment of the invention, examples of which are illustrated in the accompanying drawings. Wherever possible, the same reference numbers are used in the drawings and the description to refer to the same or like parts.

The present invention provides a multi-channel display driver circuit incorporating modified PWM D/A converters, having the advantages of high quality of imaging, relatively small size, simple architecture and low costs. With reference to FIG. 1, the a multi-channel display driver circuit incorporating modified PWM D/A converters comprises a plurality of digital comparators (10) and a non-sequential number generator (20).

Each of the digital comparators (10) has an output being connected to a corresponding data channel of a display apparatus (30), a digital data input (12), and a reference input (11) with multiple bit lines. Wherein the quantity of the bit lines of the reference input (11) is the same as that of the digital data input (12), and the bit lines are designated in sequential from the lowest bit (LSB) to the highest bit (MSB). The non-sequential number generator (20) is connected to the reference input (11) of each digital comparator (10) for generating non-sequential reference signals.

Figure 9A:
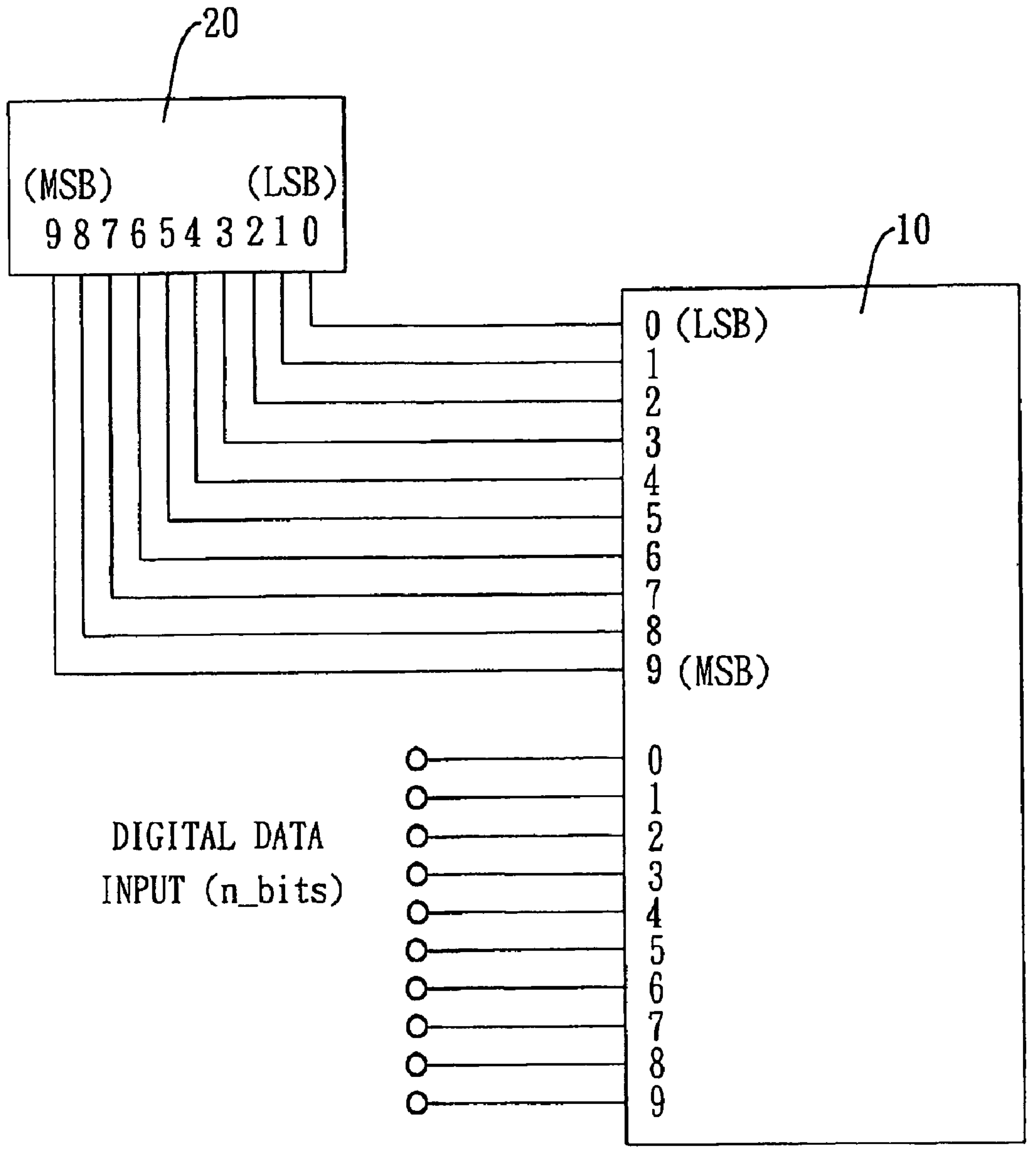
FIG. 9A shows one embodiment of the bit line connections from the output of the random number generator to reference input of each digital comparator shown in FIG. 8A.
Figure 9B:
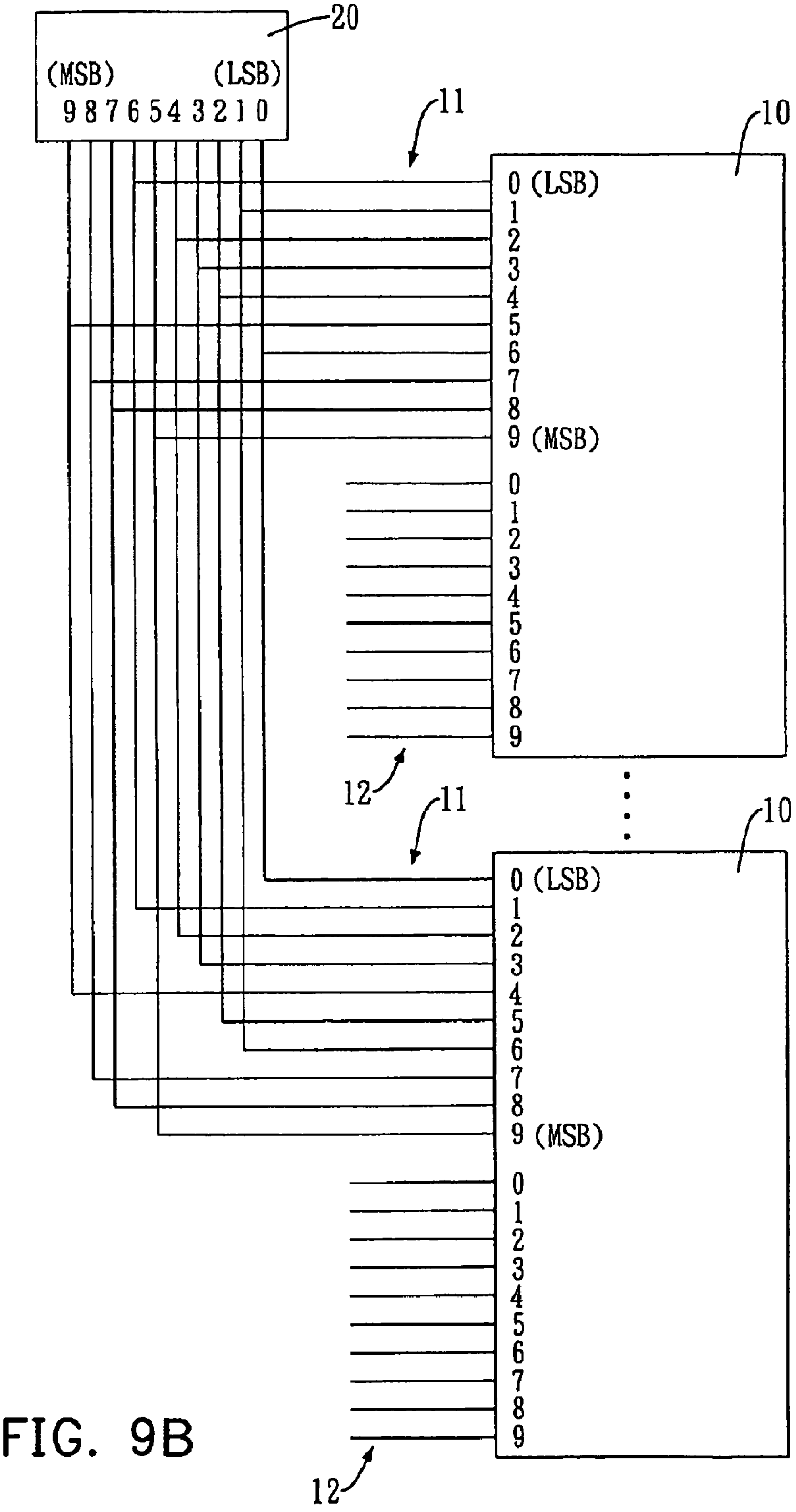
FIG. 9B shows another one embodiment of the bit line connections from the output of the random number generator to reference input of each digital comparator shown in FIG. 8A.
Figure 9C:
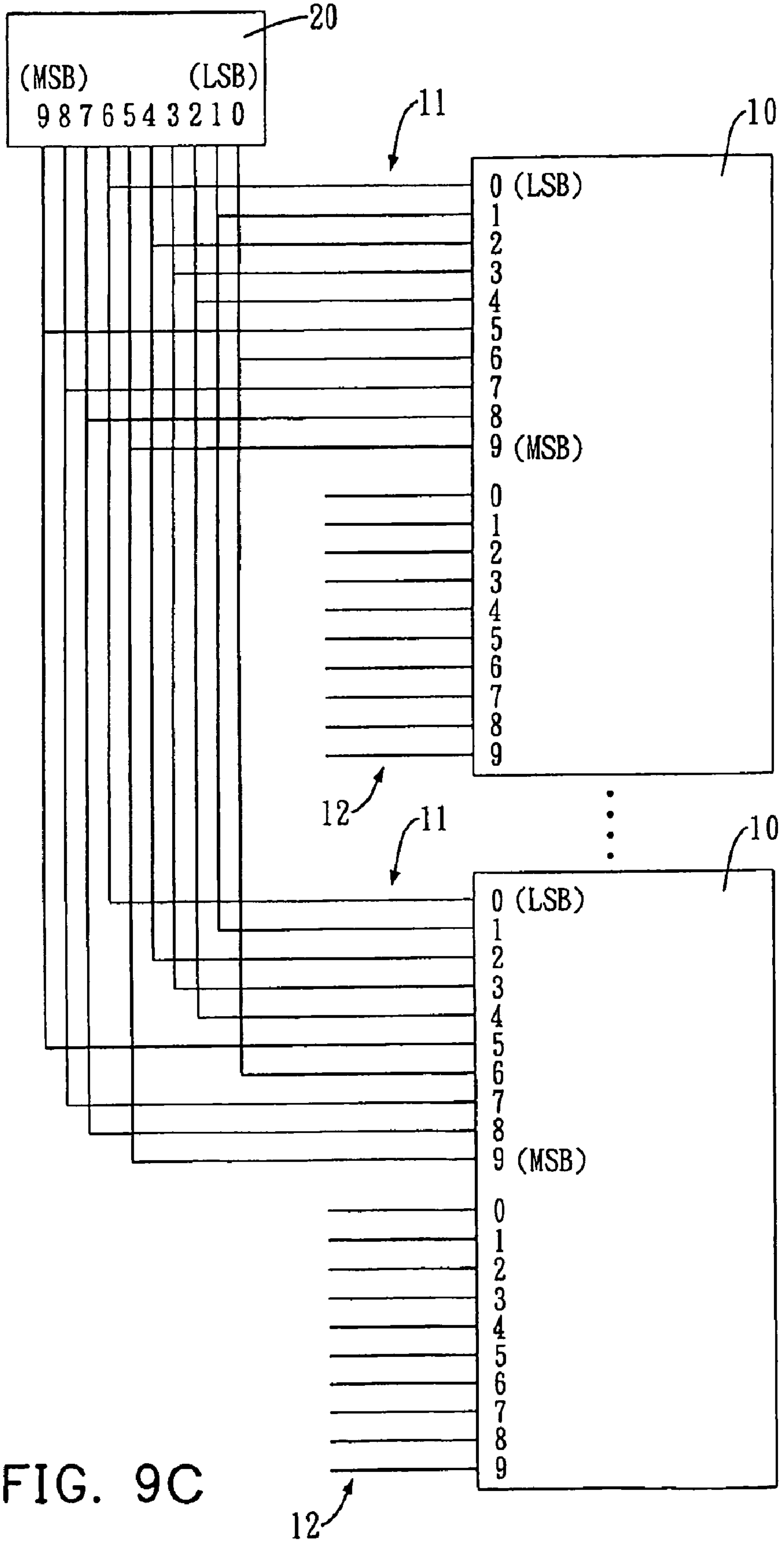
FIG. 9C shows another one embodiment of the bit line connections from the output of the random number generator to reference input of each digital comparator shown in FIG. 8A.

The non-sequential number generator (20) having an output with plural output bit lines, wherein the output bit lines are connected to the bit lines of the reference input (11) of each digital comparator (10) and may be connected sequentially (as shown in FIG. 9A) or non-sequentially (as shown in FIGS. 9B and 9C). The non-sequential number generator (20) can be a device capable of generating random numbers, or be a combination of a random number generator and a sequential counter to provide less significant bits. The random number generator can be implemented by a pseudo-random number generator.

Figure 8A:
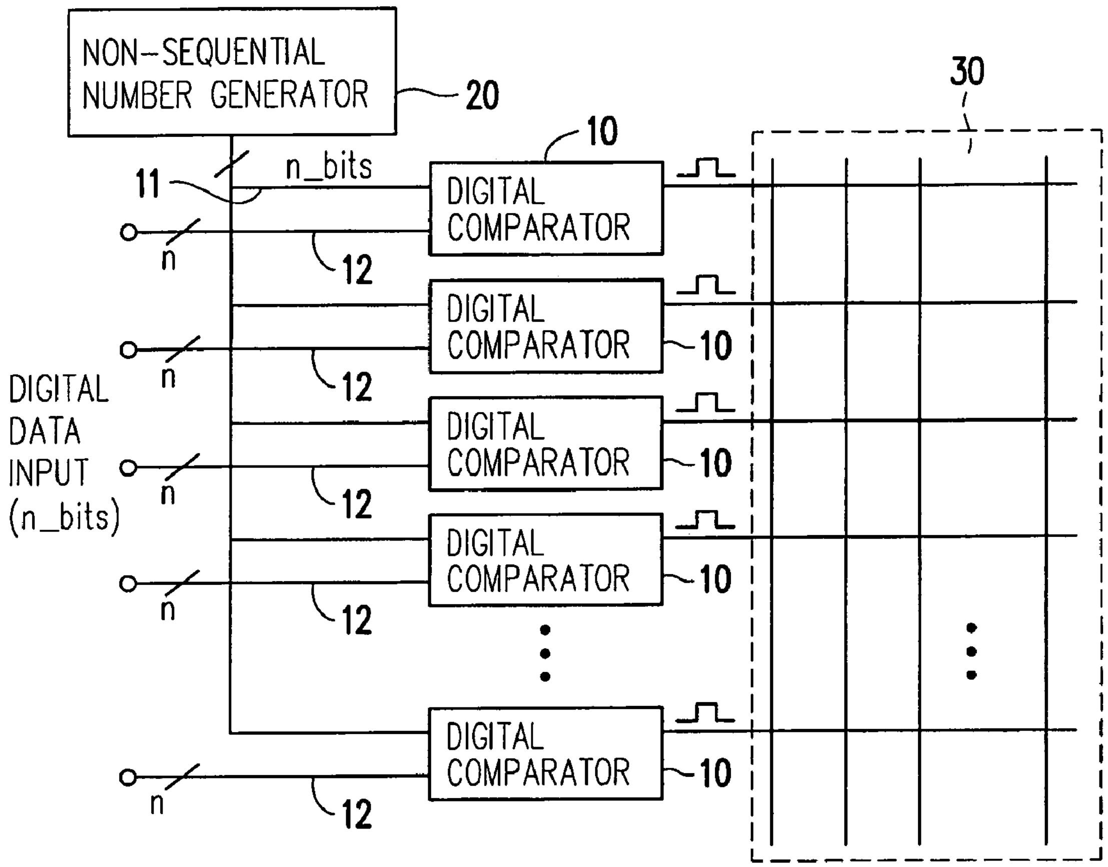
FIG. 8A is a block diagram of the system architecture of one embodiment of the present invention.
Figure 8B:
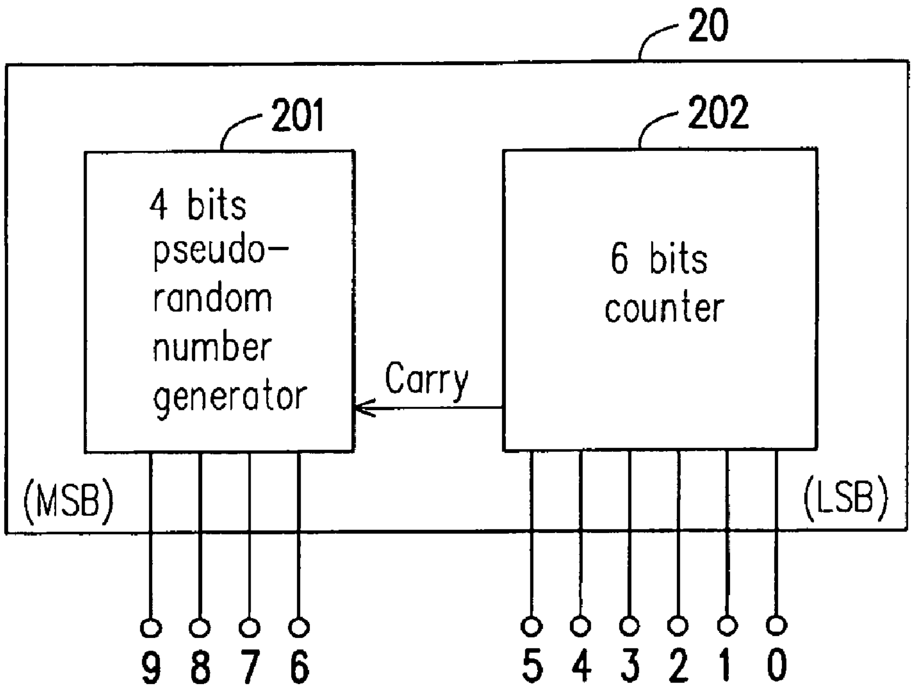
FIG. 8B is a block diagram of one embodiment of the non-sequential number generator of FIG. 8A.

Referring to FIG. 8B, FIG. 8B is a block diagram of one embodiment of the non-sequential number generator of FIG. 8A. The non-sequential number generator (20) has multiple output bit lines and comprises a 4 bits pseudo-random number generator (201) and a 6 bits counter (202). The 4 bits pseudo-random number generator produces 4 bits pseudo-random numbers, and may be a de Bruijn's counter or a LFSR counter. The 6 bits counter (202) is connected to the 4 bits pseudo-random number generator (201) in cascade, and is together with the 4 bits pseudo-random number generator (201) to produce a non-sequential reference signal outputting to the reference input of each digital comparator (10). The 6 bits counter (202) provides a plurality of less significant bits (LSBs) to the digital comparators (10), and the 4 bits pseudo-random number generator (201) provides a plurality of most significant bits (MSBs) to the digital comparators (10). The non-sequential reference signal is represented by the output bit lines of the non-sequential number generator (20).

In this embodiment, the carry signal of the 6 bits counter (202) is severed as a clock signal of the 4 bits pseudo-random number generator (201). Further, in the embodiment, the 6 LSBs are provided by the 6 bits counter (202), and the 4 MSBs are provided by the 4 bits pseudo-random number generator (201). However, the implementation of the non-sequential number generator (20) is not used to limit the scope of the present invention.

Figure 8C:
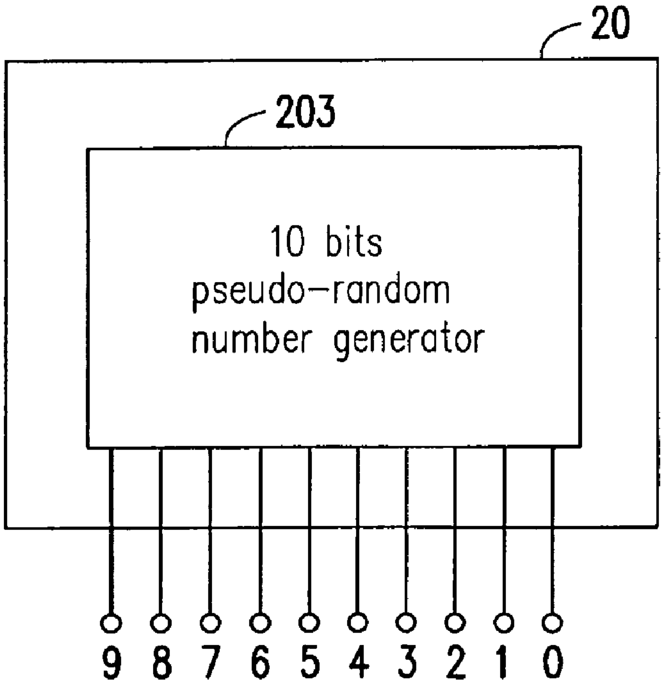
FIG. 8C is a block diagram of another one embodiment of the non-sequential number generator of FIG. 8A.

Referring to FIG. 8C, FIG. 8C is a block diagram of another one embodiment of the non-sequential number generator of FIG. 8A. In this embodiment, the non-sequential number generator (20) produces a non-sequential reference signal outputting to the reference input of each digital comparator (10), comprising a 10 bits pseudo-random number generator (203) to produce pseudo-random numbers, and wherein the random number generator (203) is a de Bruijn's counter or a LFSR counter. The non-sequential reference signal is represented by the output bit lines of the non-sequential number generator (20). However, the implementation of the non-sequential number generator (20) is not used to limit the scope of the present invention.

Figure 11A:
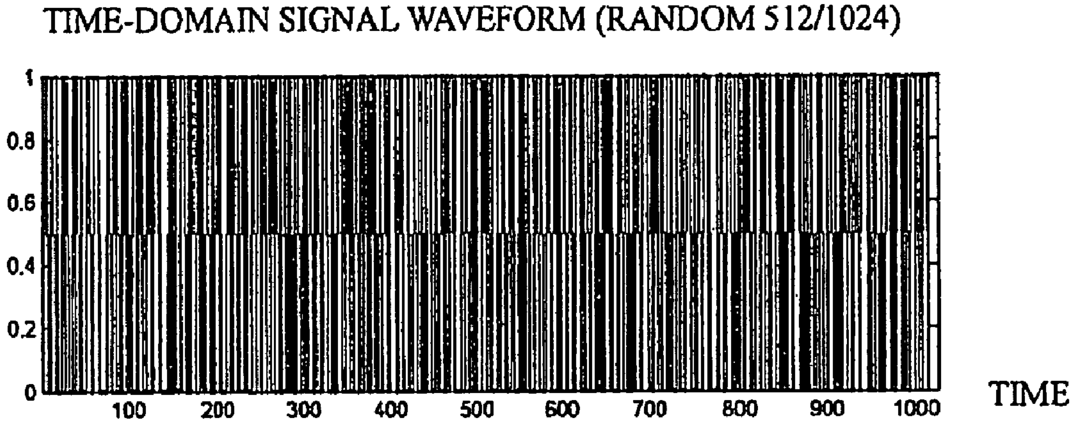
FIGS. 11A and 11B respectively show the time domain waveform of two output signals output from the digital comparator using two different digital data signals input into the modified PWM D/A converter.
Figure 11B:
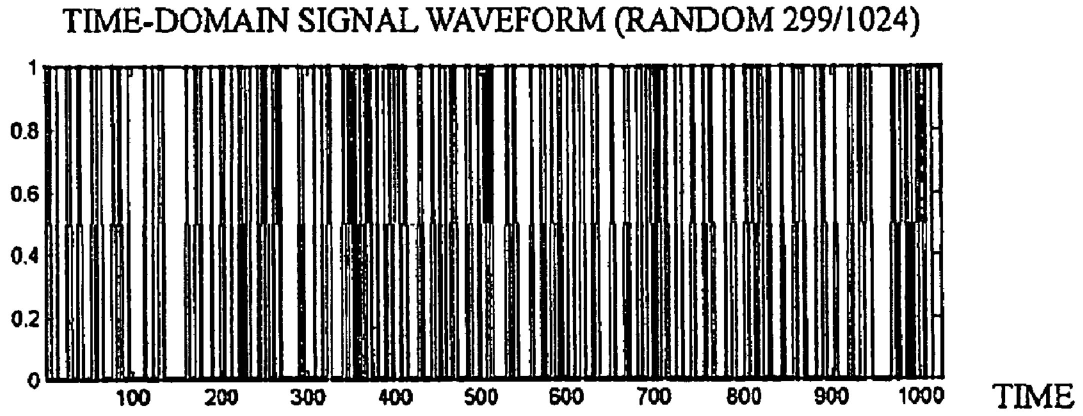

Referring FIG. 9A, FIG. 9A shows one embodiment of the bit line connections from the output of the random number generator to reference input of each digital comparator shown in FIG. 8A. It is noted that the non-sequential number generator (20) in FIG. 8A may be implemented as the number generator (20) in FIG. 8B in this embodiment. In the detailed illustration of a digital comparator (10) shown FIG. 9A, the output of the non-sequential number generator (20) is connected to each digital comparator (10) through the bit lines, and the bit lines are arranged in sequential order from the lowest to the highest. Each digital comparator (10) is used to compare the reference signal output from non-sequential number generator (20) with the digital data signal to generate an output signal with pulses. With reference to FIGS. 11A and 11B, the two different waveforms of the output signals are generated by the same digital comparator (10) in a given time period while using two digital data signals with different DC magnitudes.

FIG. 11A shows the waveform of the output signal from the digital comparator (10) while using a digital data signal with 512 DC magnitude as its data input signal. In another aspect, FIG. 11B shows the waveform of the output signal from the same digital comparator (10) while using a digital data signal with 299 DC magnitude as its data input signal. According to FIGS. 11A and 11B, the output signals are evenly distributed throughout the time period. Since the 512 DC magnitude of the digital data signal is greater than the 299 DC magnitude of the digital data signal, the pulses of the waveform in FIG. 11A are more clustered than that of the waveform in FIG. 11B.

Figure 12A:
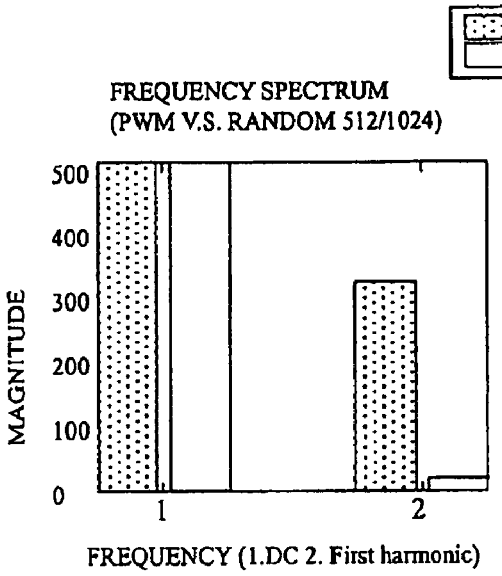
FIGS. 12A and 12B show two comparative outputs of the modified D/A converter and conventional PWM D/A converter when two different digital data signals are input into the D/A converters, in which the DC magnitude of first harmonics for two different digital data signals input into the modified PWM D/A converter are clearly demonstrated.
Figure 12B:
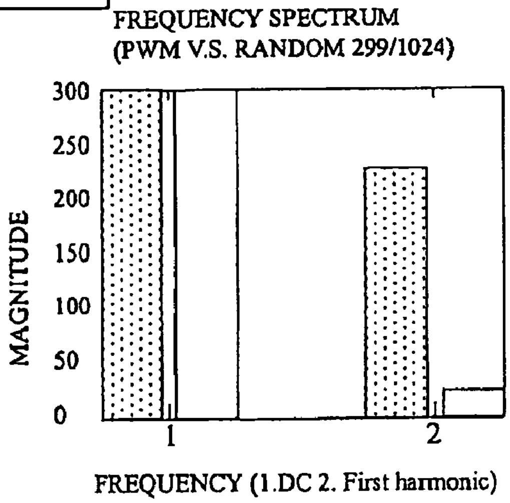
Figure 13:
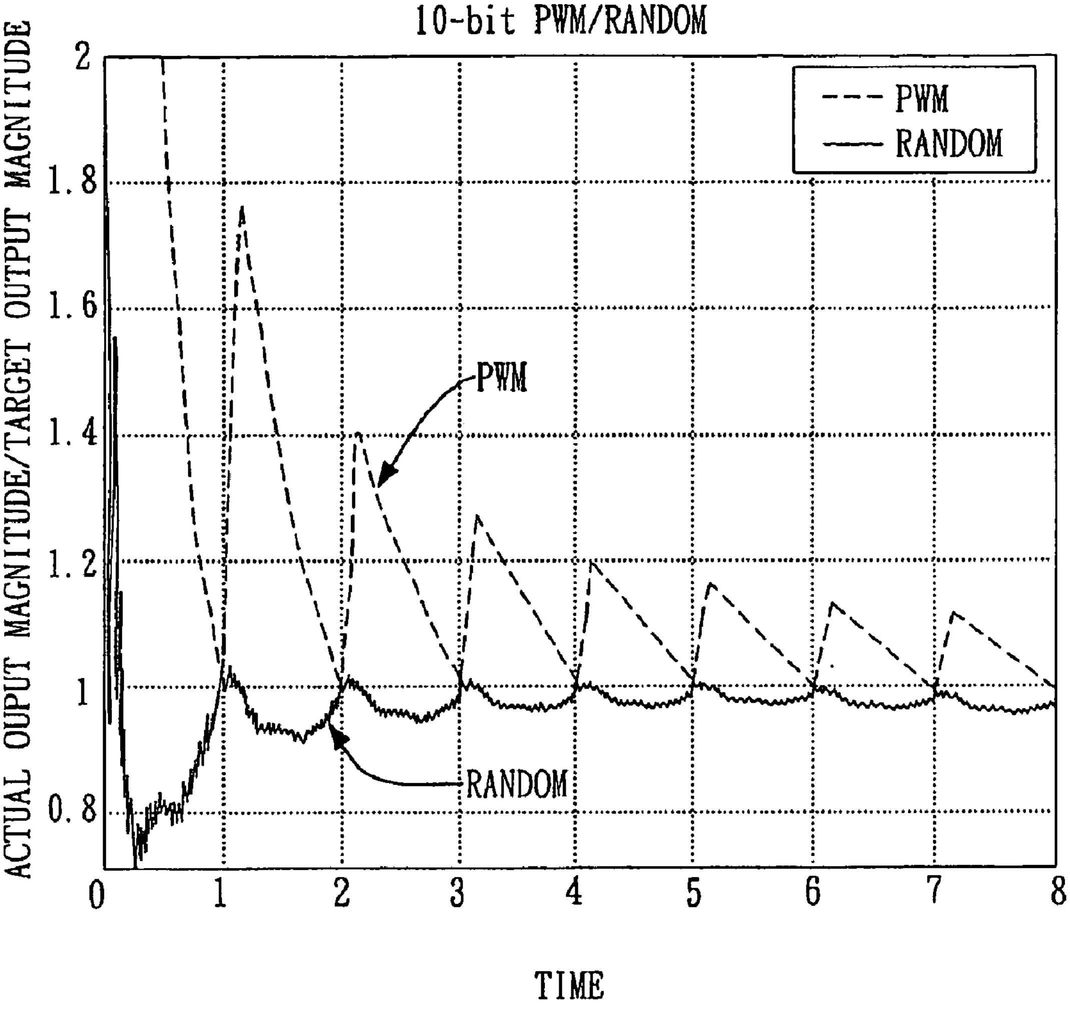
FIG. 13 is a comparative diagram of output accuracy measured from the proposed D/A converter and the conventional D/A converter in a given time period.

Since the high and low voltages of the output signal are evenly distributed throughout the time period, the sampled average DC level in any time period will be closely approximate to the DC level of the input digital data signal. When comparing the present invention with the conventional pulse width modulated (PWM) D/A converter circuit, as shown in FIG. 13, where the horizontal axis represents the time domain, and the vertical axis is the ratio of actual output magnitude over the target output magnitude. It is found that the ratio, which is obtained by the present invention, more closely approximates the target value (ideal rate=1.0). Especially, when the analog signal waveform is not sampled within a complete output cycle, thus the problem of image distortion as a result of overshoot distortion of the DC level can be prevented. Also, in FIGS. 12A and 12B, it is clearly demonstrated that the first harmonics can be effectively mitigated by the present invention as opposed to the conventional pulse width modulated (PWM) D/A converter circuit, thus data imaging free from distortions can be assured.

With reference to FIG. 9B, another one embodiment in accordance with the present invention is slightly different from the embodiment as stated above. It is noted that the non-sequential number generator (20) in FIG. 8A may be implemented as the number generator (20) in FIG. 8B or 8C in this embodiment. The output bit lines of the non-sequential number generator (20) are non-sequentially connected to the bit lines of the reference input (11) of each digital comparator (10). Moreover, it is noted each connection between the non-sequential number generator (20) and the digital comparator (10) is different from others so as to prevent simultaneous output switching of the digital comparators (10) if the digital data signals are input to the digital data input (12) of each digital comparator (10).

By changing the connections between the non-sequential number generator (20) and the digital comparators (10), each digital comparator (10) will receive an independent reference signal, whereby the chance of the digital comparators (10) making a simultaneous switch is considerably reduced. Therefore, in the circuit layout for the digital comparators (10), the bit lines connected between the number generator (20) and the digital comparators (10) are arranged more compactly during the circuit layout without causing electromagnetic interference.

If the reference input (11) of each digital comparator (10) is connected to the output of the non-sequential number generator (20) in the same order, and all digital comparator (10) receive the same digital signal, the outputs of all digital comparators (10) will be switched simultaneously. Thus a considerable amount of electromagnetic interference is created. Also, the simultaneous switching in the digital comparators (10) will produce a surge current from the D/A converter circuits due to parasitic inductance collected from adjacent bit lines, which may damage the components. Therefore, connecting the output bit lines of the non-sequential number generator (20) and the bit lines s of the reference input (11) of the digital comparators (10) in different orders is able to prevent simultaneous switching of the digital comparators. Therefore, lowering the effect of electromagnetic interference could ensure the precise images shown on the display.

With reference to FIG. 9C, another one embodiment in accordance with the present invention is designed to correct the output DC level distortion of a conventional PWM D/A converter circuit. It is noted that the non-sequential number generator (20) in FIG. 8A may be implemented as the number generator (20) in FIG. 8B or 8C in this embodiment. The output bits of the non-sequential number generator (20) are non-sequentially connected to the bit lines of the reference input (11) of each digital comparator (10). For example, the lowest bit (LSB) of the non-sequential number generator (20) is not correspondingly connected to the lowest bits (LSB) of all the digital comparators (10). Therefore, each digital comparator (10) is provided with the same non-sequential reference signal. It is noted that, in some case the embodiment of FIG. 9B may perform better than that of FIG. 9C, since in FIG. 9B, the embodiment prevents simultaneous output switching of the digital comparators (10).

Figure 10A:
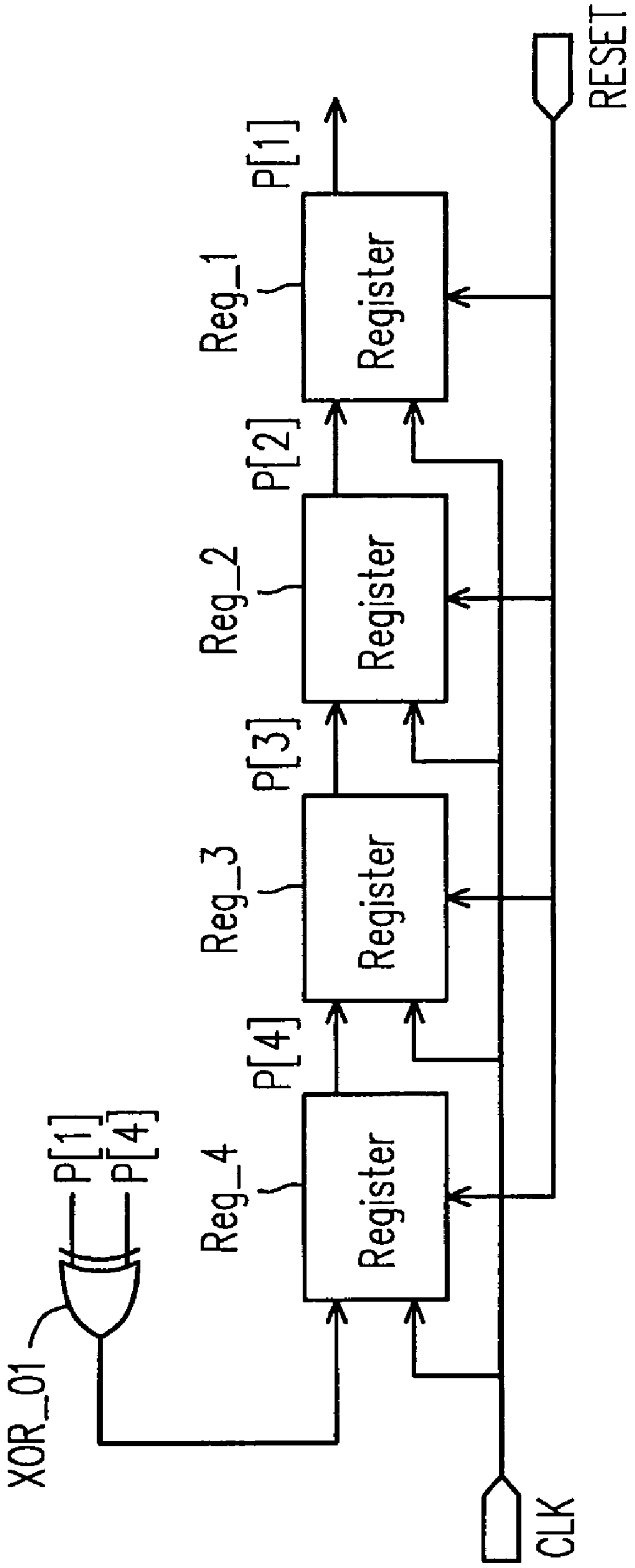
FIG. 10A is a logic circuit diagram for a pseudo-random number generator of FIG. 8B implemented by a LFSR counter with a lock-up state.

Referring to FIG. 10A, FIG. 10A is a logic circuit diagram for a pseudo-random number generator of FIG. 8B implemented by a LFSR counter with a lock-up state. The pseudo-random number generator is a 4 bits LFSR counter, comprising four registers Reg_1~Reg_4 and an exclusive-or gate XOR_01. As stated above, the clock signal CLK is the carry signal of the 6 bits counter 202 of FIG. 8B. The connections of each of the elements in FIG. 10A is shown in FIG. 10A, and are not described herein. The 4 bits LFSR counter has a $(2^4-1)$ cycle length (i.e. having 15 states). If the noise or EMI makes stored values of all registers Reg_1~Reg_4 be 0, the 4 bits LFSR counter may be lock-up. That is, the 4 bits LFSR counter in this embodiment has a lock-up state. If the 10 bits LFSR counter enters the lock-up state, the reset signal must be asserted to reset the 4 bits LFSR counter. The outputs P[1]~P[4] of the registers Reg_1~Reg_4 are served as the MSB outputs of the non-sequential number generator (20) of FIG. 8B.

Figure 10B:
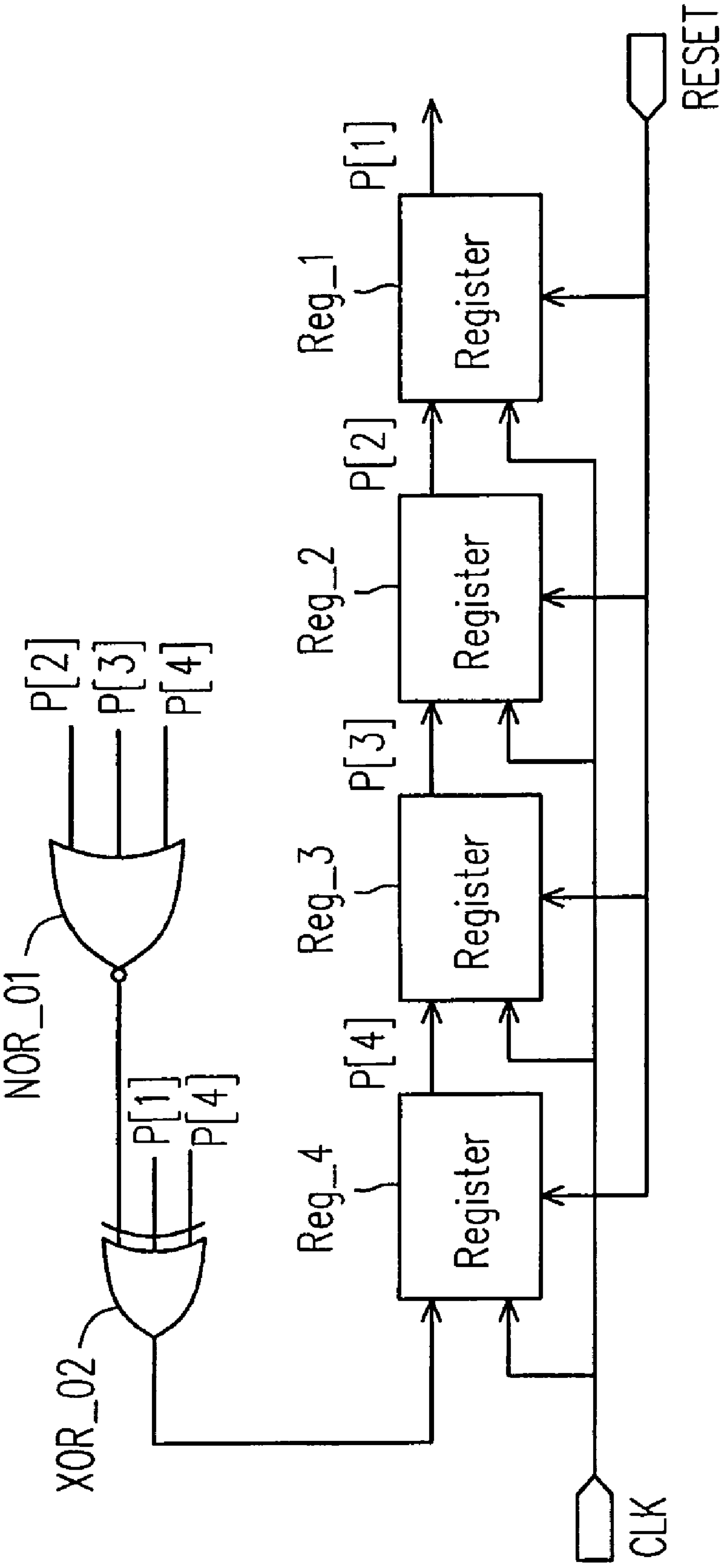
FIG. 10B is a logic circuit diagram for a pseudo-random number generator of FIG. 8B implemented by a de Bruijn's counter.

Referring to FIG. 10B, FIG. 10B is a logic circuit diagram for a pseudo-random number generator of FIG. 8B implemented by a de Bruijn's counter. In this embodiment, the pseudo-random number generator is a 4 bits de Bruijn's counter, comprising four registers Reg_1~Reg_4, an exclusive-or gate XOR_02, and a nor gate NOR_01. The connections of each of the elements in FIG. 10B is shown in FIG. 10B, and are not described herein. The 10 bits de Bruijn's counter has a $2^4$ cycle length (i.e. having 16 states). Even the noise or EMI makes stored values of all registers Reg_1~Reg_4 be 0, the 10 bits de Bruijn's counter should not be lock-up. That is, the 10 bits de Bruijn's counter in this embodiment has no lock-up state. The outputs P[1]~P[4] of the registers Reg_1~Reg_4, are served as the MSB outputs of the non-sequential number generator (20) of FIG. 8C.

Figure 10C:
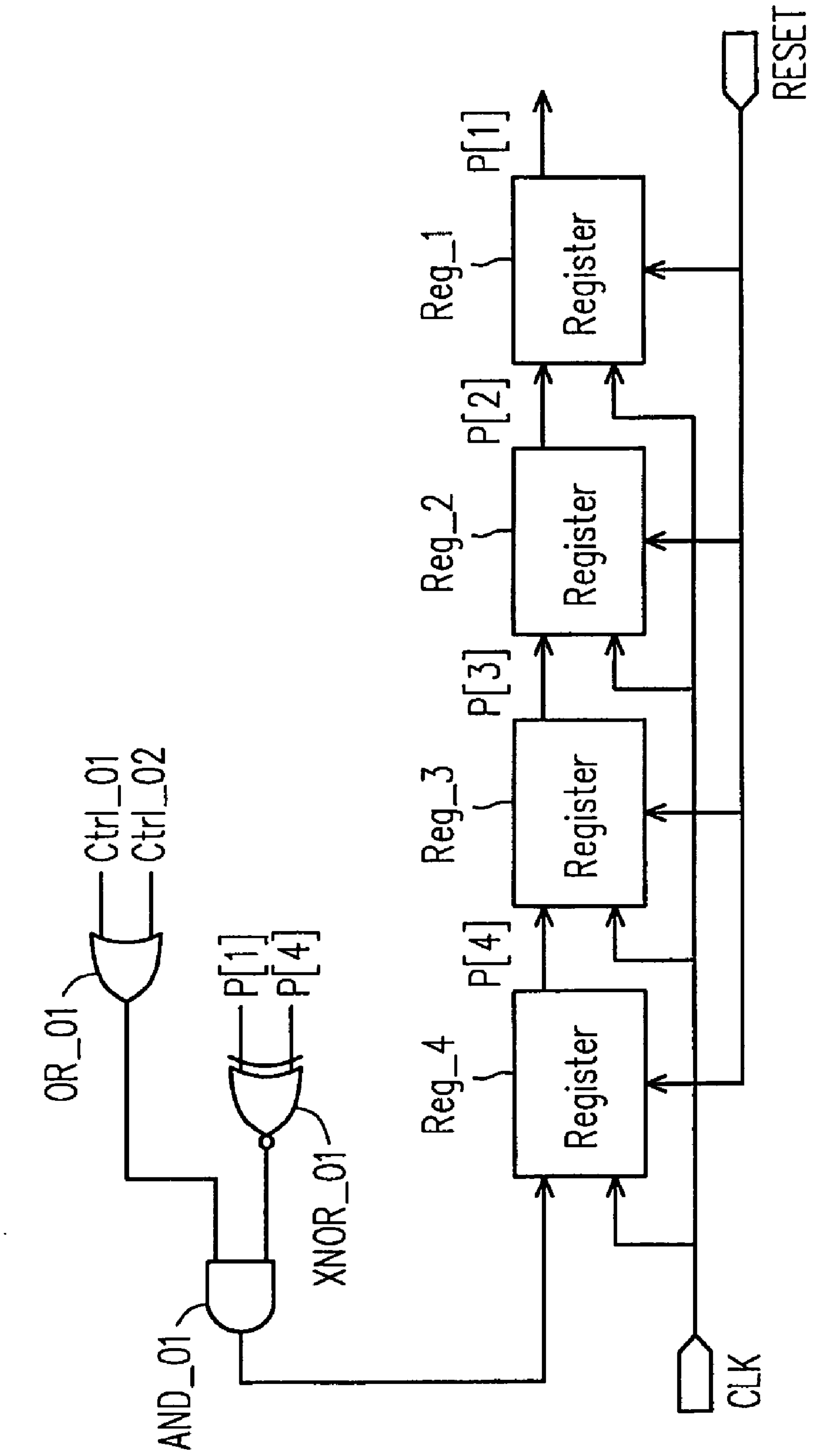
FIG. 10C is a logic circuit diagram for a pseudo-random number generator of FIG. 8B implemented by a LFSR counter without a lock-up state.

Referring to FIG. 10C, FIG. 10C is a logic circuit diagram for a pseudorandom number generator of FIG. 8B implemented by a LFSR counter without a lock-up state In this embodiment, the pseudo-random number generator is a 4 bits LFSR counter, comprising four registers Reg_1~Reg_4, an exclusive-nor gate XNOR_01, and an or gate OR_01. The connections of each of the elements in FIG. 10C is shown in FIG. 10C, and are not described herein. The outputs P[1]~P[4] of the registers Reg_1~Reg_10 are served as the MSB outputs of the non-sequential number generator (20) of FIG. 8C.

When the signal Ctrl_2 is set to be 0, and the signal Ctrl_1 is the logic and operation result of the values P[1]~P[3], the 4 bits LFSR counter has a $2^4$ cycle length (i.e. having 16 states) and no lock-up state. Even the noise or EMI makes stored values of all registers Reg_1~Reg_4 be 0, the 4 bits LFSR counter should not be lock-up.

When the signal Ctrl_2 is set to be 0, and the signal Ctrl_1 is the logic and operation result of the values P[1]~P[4], the 4 bits LFSR counter has a $(2^4-1)$ cycle length (i.e. having 16 states) and no lock-up state. Even the noise or EMI makes stored values of all registers Reg_1~Reg_4 be 0, the 10 bits LFSR counter should not be lock-up.

Furthermore, when the signal Ctrl_2 is the logic and operation result of the values P[1]~P[4], and the signal Ctrl_1 is the logic and operation result of the values arbitrarily selected from the values P[1]~P[4], the 4 bits LFSR counter has a arbitrary cycle length and no lock-up state. Even the noise or EMI makes stored values of all registers Reg_1~Reg_4 be 0, the 4 bits LFSR counter should not be lock-up.

Figure 10D:
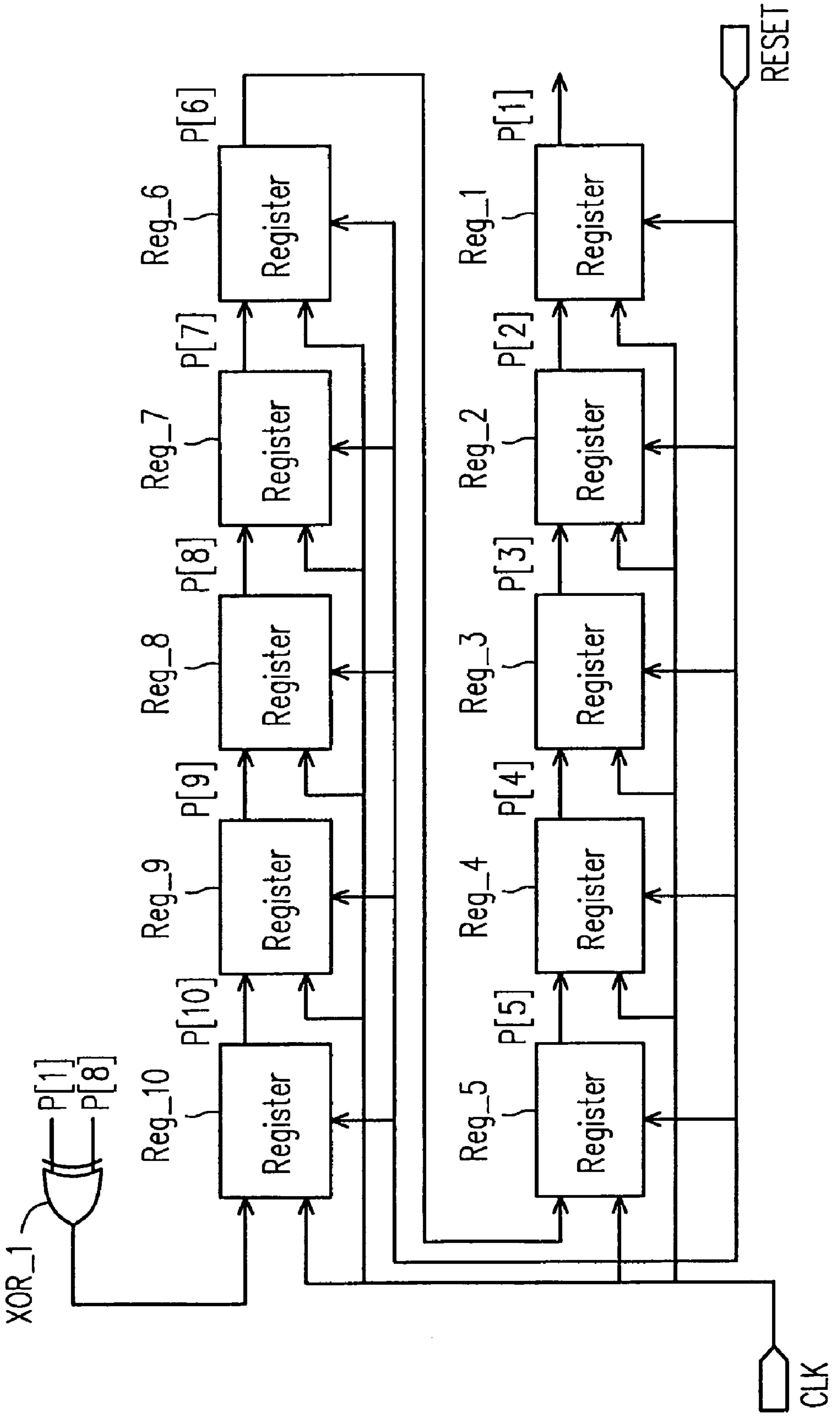
FIG. 10D is a logic circuit diagram for a pseudo-random number generator of FIG. 8C implemented by a LFSR counter with a lock-up state.

Referring to FIG. 10D, FIG. 10D is a logic circuit diagram for a pseudo-random number generator of FIG. 8C implemented by a LFSR counter with a lock-up state. The pseudo-random number generator is a 10 bits LFSR counter, comprising ten registers Reg_1~Reg_10 and an exclusive-or gate XOR_1. The connections of each of the elements in FIG. 10D is shown in FIG. 10D, and are not described herein. The 10 bits LFSR counter has a $(2^{10}-1)$ cycle length (i.e. having 1023 states). If the noise or EMI makes stored values of all registers Reg_1~Reg_10 be 0, the 10 bits LFSR counter may be lock-up. That is, the 10 bits LFSR counter in this embodiment has a lock-up state. If the 10 bits LFSR counter enters the lock-up state, the reset signal must be asserted to reset the 10 bits LFSR counter. The outputs P[1]~P[10] of the registers Reg_1~Reg_10 are served as the outputs of the non-sequential number generator (20) of FIG. 8C.

Figure 10E:
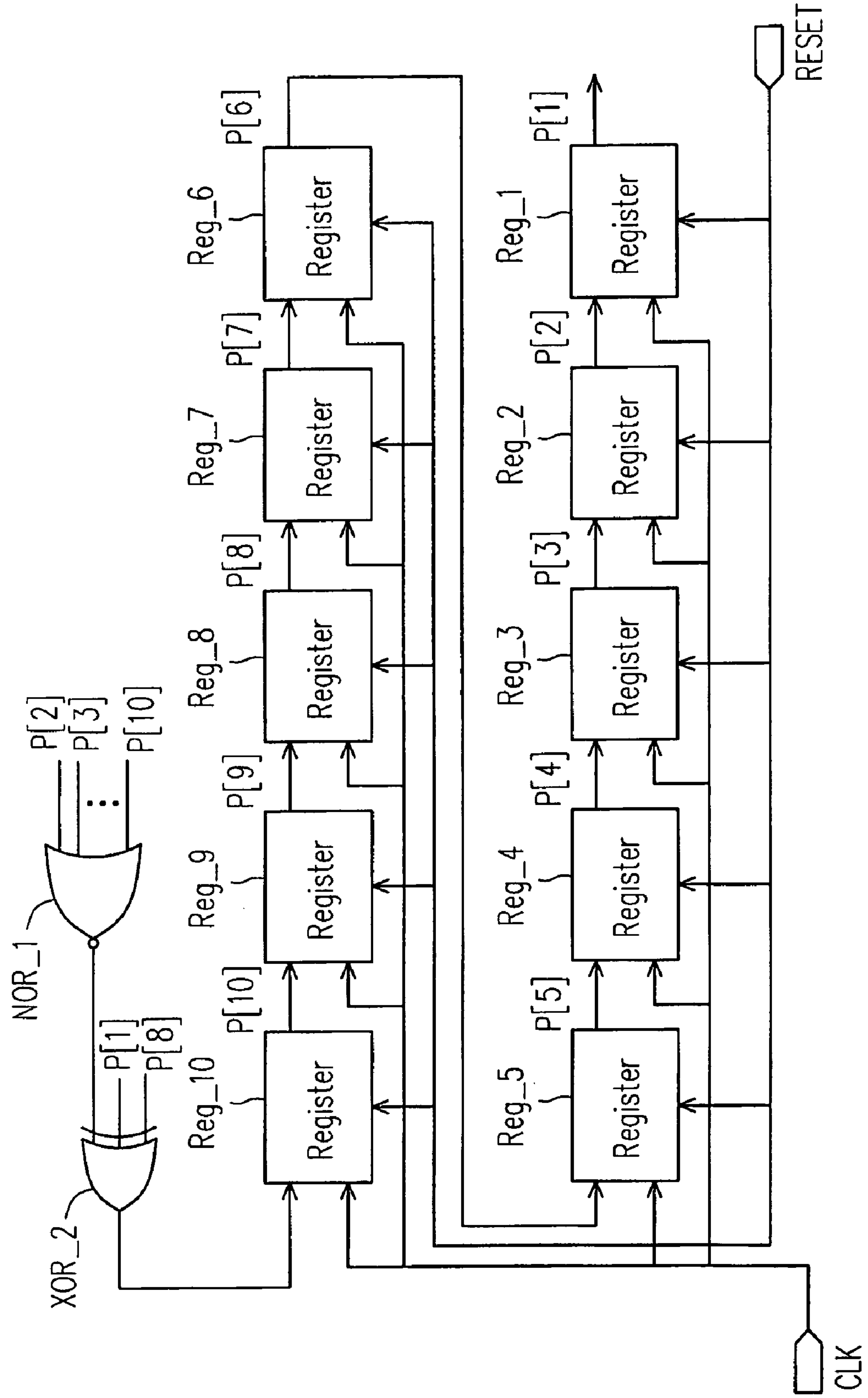
FIG. 10E is a logic circuit diagram for a pseudo-random number generator of FIG. 8C implemented by a de Bruijn's counter.

Referring to FIG. 10E, FIG. 10E is a logic circuit diagram for a pseudo-random number generator of FIG. 8C implemented by a de Bruijn's counter. In this embodiment, the pseudo-random number generator is a 10 bits de Bruijn's counter, comprising ten registers Reg_1~Reg_10, an exclusive-or gate XOR_2, and a nor gate NOR_1. The connections of each of the elements in FIG. 10E is shown in FIG. 10E, and are not described herein. The 10 bits de Bruijn's counter has a 210 cycle length (i.e. having 1024 states). Even the noise or EMI makes stored values of all registers Reg_1~Reg_10 be 0, the 10 bits de Bruijn's counter should not be lock-up. That is, the 10 bits de Bruijn's counter in this embodiment has no lock-up state. The outputs P[1]~P[10] of the registers Reg_1~Reg_10 are served as the outputs of the non-sequential number generator (20) of FIG. 8C.

Figure 10F:
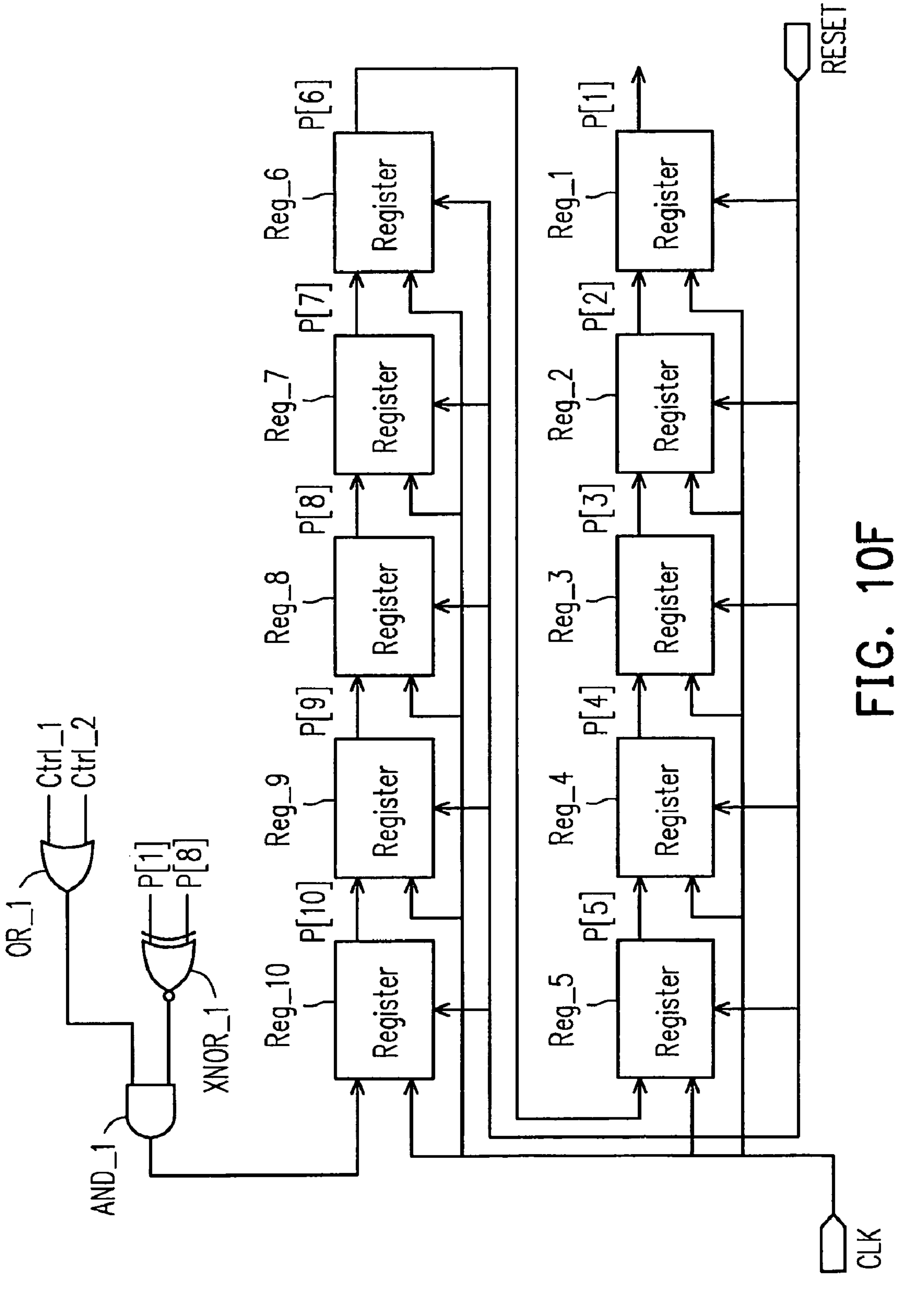
FIG. 10F is a logic circuit diagram for a pseudo-random number generator of FIG. 8C implemented by a LFSR counter without a lock-up state.

Referring to FIG. 10F, FIG. 10F is a logic circuit diagram for a pseudo-random number generator of FIG. 8C implemented by a LFSR counter without a lock-up state In this embodiment, the pseudo-random number generator is a 10 bits LFSR counter, comprising ten registers Reg_1~Reg_10, an exclusive-nor gate XNOR_1, and an or gate OR_1. The connections of each of the elements in FIG. 10F is shown in FIG. 10F, and are not described herein. The outputs P[1]~P[10] of the registers Reg_1~Reg_10 are served as the outputs of the non-sequential number generator (20) of FIG. 8C.

When the signal Ctrl_2 is set to be 0, and the signal Ctrl_1 is the logic and operation result of the values P[1]~P[9], the 10 bits LFSR counter has a 210 cycle length (i.e. having 1024 states) and no lock-up state. Even the noise or EMI makes stored values of all registers Reg_1~Reg_10 be 0, the 10 bits LFSR counter should not be lock-up.

When the signal Ctrl_2 is set to be 0, and the signal Ctrl_1 is the logic and operation result of the values P[1]~P[10], the 10 bits LFSR counter has a $(2^{10}-1)$ cycle length (i.e. having 1023 states) and no lock-up state. Even the noise or EMI makes stored values of all registers Reg_1~Reg_10 be 0, the 10 bits LFSR counter should not be lock-up.

Furthermore, when the signal Ctrl_2 is the logic and operation result of the values P[1]~P[10], and the signal Ctrl_1 is the logic and operation result of the values arbitrarily selected from the values P[1]~P[10], the 10 bits LFSR counter has a arbitrary cycle length and no lock-up state. Even the noise or EMI makes stored values of all registers Reg_1~Reg_10 be 0, the 10 bits LFSR counter should not be lock-up.

In summary, the present invention is advantageous over the conventional PWM D/A converter circuit for the following reasons. First, as the reference input to the digital comparator is based on a non-sequential number, the output signal has the high and low levels evenly distributed over the time period. This can significantly reduce the first harmonic and avoid the overshoot distortion of DC levels when the output signal is not sampled during a complete output cycle. Second, by changing the order of bit lines connected from the output of the number generator to each digital comparator in a non-sequential order, electromagnetic interference can be considerably suppressed. This technique can also be applied on conventional PWM D/A converter circuits to suppress electromagnetic interference. Third, as the multiple digital comparators are connected to a number generator, the total component count is less than using the sigma-delta modulation technique, so more circuit space can be saved in the circuit layout, but the image quality is better than conventional PWM D/A converter circuit.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A multi-channel display driver circuit incorporating modified digital-to-analog (D/A) converters, comprising:

a plurality of digital comparators, each of which has a digital data input, a reference input with multiple bit lines, and an output that is connected to a corresponding data channel of a display apparatus; and a non-sequential number generator, having multiple output bit lines, comprising:

a pseudo-random number generator to produce pseudo-random numbers, wherein the pseudo-random number generator is a de Bruijn's counter or a linear-feedback shift register (LFSR) counter; and a counter, connected to the pseudo-random number generator in cascade, together with the pseudo-random number generator to produce a non-sequential reference signal outputting to the reference input of each digital comparator, wherein the counter provides a plurality of less significant bits to the digital comparators, and the pseudo-random number generator provides a plurality of most significant bits to the digital comparators;

wherein the non-sequential reference signal is represented by the output bit lines of the non-sequential number generator.

2. The multi-channel display driver circuit incorporating modified D/A converters as claimed in claim 1, wherein the bit lines of the reference input of each digital comparator are sequentially connected to the output bit lines of the non-sequential number generator.

3. The multi-channel display driver circuit incorporating modified D/A converters as claimed in claim 1, wherein the bit lines of the reference input of each digital comparator are non-sequentially connected to the output bit lines of the non-sequential number generator, whereby each digital comparator receives the same non-sequential reference signal.

4. The multi-channel display driver circuit incorporating modified D/A converters as claimed in claim 1, wherein the LFSR counter is designed to have $2^n$ cycle length, and n is the bit number of the LFSR counter.

5. The multi-channel display driver circuit incorporating modified D/A converters as claimed in claim 1, wherein the LFSR counter is designed to have a $(2^n-1)$ cycle length without any lock-up state, and n is the bit number of the LFSR counter.

6. A multi-channel display driver circuit incorporating modified digital-to-analog (D/A) converters, comprising:

a plurality of digital comparators, each of which has a digital data input, a reference input with multiple bit lines, and an output that is connected to a corresponding data channel of a display apparatus; and a non-sequential number generator with multiple output bit lines, producing a non-sequential reference signal outputting to the reference input of each digital comparator, comprising:

a pseudo-random number generator to produce pseudo-random numbers, wherein the random number generator is a de Bruijn's counter or a LFSR counter;

wherein the non-sequential reference signal is represented by the output bit lines of the non-sequential number generator, the bit lines of the reference input of each digital comparator are non-sequentially connected to the output bit lines of the non-sequential number generator, and each connection between the digital comparator and the output bit lines is different from others, whereby each digital comparator receives a unique sequence value and a unique reference signal and compares the unique reference signal and an independent data input signal which is represented by a digital data input with multiple bit lines of each comparator.

7. The multi-channel display driver circuit incorporating the modified D/A converters as claimed in claim 6, wherein the non-sequential number generator further comprises:

a counter, connected to the non-sequential number generator in cascade, together with the non-sequential number generator to produce a non-sequential reference signal outputting to the reference input of each digital comparator.

8. The multi-channel display driver circuit incorporating modified D/A converters as claimed in claim 6, wherein the LFSR counter is designed to have $2^n$ cycle length, and n is the bit number of the LFSR counter.

9. The multi-channel display driver circuit incorporating modified D/A converters as claimed in claim 6, wherein the LFSR counter is designed to have a $(2^n-1)$ cycle length without any lock-up state, and n is the bit number of the LFSR counter.

* * * * *